(12) United States Patent
Kim et al.

(10) Patent No.: US 10,577,696 B2
(45) Date of Patent: Mar. 3, 2020

(54) COPPER ETCHANT COMPOSITION

(71) Applicant: ENF TECHNOLOGY CO., LTD., Gyeonggi-do (KR)

(72) Inventors: Seul Ki Kim, Chungcheongnam-do (KR); Se Hoon Kim, Chungcheongnam-do (KR)

(73) Assignee: ENF Technology CO., LTD., Gyeonggi-do (KR)

( * ) Notice: Subject to any disclaimer, the term of this patent is extended or adjusted under 35 U.S.C. 154(b) by 0 days.

(21) Appl. No.: 15/387,456

(22) Filed: Dec. 21, 2016

(65) Prior Publication Data

US 2017/0175274 A1 Jun. 22, 2017

(30) Foreign Application Priority Data

Dec. 22, 2015 (KR) .................. 10-2015-0183740

(51) Int. Cl.
| | | |
|---|---|---|
| C23F 1/00 | (2006.01) | |
| C23F 1/02 | (2006.01) | |
| C23F 1/10 | (2006.01) | |
| C23F 1/14 | (2006.01) | |
| C23F 1/16 | (2006.01) | |
| C23F 1/18 | (2006.01) | |
| C23F 1/44 | (2006.01) | |
| C23F 1/46 | (2006.01) | |
| C23F 4/00 | (2006.01) | |
| H01L 21/04 | (2006.01) | |
| H01L 21/306 | (2006.01) | |
| H01L 21/3213 | (2006.01) | |
| H01L 21/768 | (2006.01) | |

(52) U.S. Cl.
CPC .................. *C23F 1/18* (2013.01); *C23F 1/00* (2013.01); *C23F 1/02* (2013.01); *C23F 1/10* (2013.01); *C23F 1/14* (2013.01); *C23F 1/16* (2013.01); *C23F 1/44* (2013.01); *C23F 1/46* (2013.01); *H01L 21/042* (2013.01); *H01L 21/30604* (2013.01); *H01L 21/30608* (2013.01); *H01L 21/32133* (2013.01); *H01L 21/32134* (2013.01); *C23F 4/00* (2013.01); *H01L 21/76885* (2013.01)

(58) Field of Classification Search
None
See application file for complete search history.

(56) References Cited

U.S. PATENT DOCUMENTS

| | | | | |
|---|---|---|---|---|
| 3,773,577 A | * | 11/1973 | Shibasaki | ................ C23F 1/18 216/106 |
| 2004/0118814 A1 | | 6/2004 | Kim et al. | |
| 2009/0301382 A1 | * | 12/2009 | Patel | ........................ G01D 3/10 116/201 |

(Continued)

FOREIGN PATENT DOCUMENTS

| | | |
|---|---|---|
| CN | 1510169 A | 7/2004 |
| CN | 103282549 A | 9/2013 |

(Continued)

*Primary Examiner* — Stephanie P Duclair
(74) *Attorney, Agent, or Firm* — McCoy Russell LLP

(57) ABSTRACT

Provided is a copper etchant composition including: a first organic acid containing one or more amine groups, and one or more carboxylic acid groups; a second organic acid; an amine compound; hydrogen peroxide; and a phosphate compound, which has the increased number of processing sheets and etching uniformity, when etching copper.

2 Claims, 2 Drawing Sheets

(56) References Cited

U.S. PATENT DOCUMENTS

2014/0038348 A1* 2/2014 Kim .................. H01L 29/66969
    438/99
2014/0162403 A1* 6/2014 Okabe ....................... C23F 1/18
    438/104

FOREIGN PATENT DOCUMENTS

| CN | 103911613 A | 7/2014 |
|----|-------------|--------|
| JP | 2003138389 A | 5/2003 |
| JP | 2006009122 A | 1/2006 |
| JP | 2006111953 A | 4/2006 |
| JP | 3962239 B2 | 8/2007 |
| JP | 4430990 B2 | 3/2010 |

* cited by examiner

COPPER ETCHANT COMPOSITION

CROSS-REFERENCE TO RELATED APPLICATIONS

This application claims priority under 35 U.S.C. § 119 to Korean Patent Application No. 10-2015-0183740, filed on Dec. 22, 2015, in the Korean Intellectual Property Office, the entire disclosure of which is incorporated herein by reference in its entirety for all purposes.

TECHNICAL FIELD

The following disclosure relates to a copper etchant composition for etching copper or a copper alloy.

BACKGROUND

In order to achieve finer wiring, higher density and high reliability of a substrate when manufacturing a semiconductor package substrate, a semi-additive process using plating for forming a conductor was suggested, and is being actively applied.

However, a copper etchant composition in a conventional semi-additive process had a change in etching properties, such as an increased metal content in the etchant composition (the increased number of processing sheets) as an etching process proceeds, or reduced etching rate and etching uniformity with increased processing time, which resulted in a fault phenomenon, such as non-uniform etching of a copper seed layer, and causing a residue.

Accordingly, there is currently a continuous demand for development of a copper etchant composition having excellent etching uniformity, and no change in etching properties depending on the number of processing sheets and etching time.

In the semi-additive process, sulfuric acid/hydrogen peroxide-based (Japanese Patent Registration No. 4430990), hydrochloric acid/cupric-based (Japanese Patent Laid-Open Publication No. 2006-111953), and hydrochloric acid/ferrous-based (Japanese Patent Registration No. 3962239) copper etchants have been suggested, as a copper etchant used for removing a copper plating film which is a seed layer.'

RELATED ART DOCUMENT

Patent Document

Japanese Patent Registration No. 4430990 (Dec. 25, 2009)
Japanese Patent Laid-Open Publication No. 2006-111953 (Apr. 27, 2006)
Japanese Patent Registration No. 3962239 (May 25, 2007)

SUMMARY

Technical Problem

An embodiment of the present invention is directed to providing a copper etchant composition having excellent copper etching performance, and having the increased number of processing sheets and etching uniformity when etching copper.

Solution to Problem

In one general aspect, a copper etchant composition includes: a first organic acid containing one or more amine groups, and one or more carboxylic acid groups; a second organic acid; an amine compound; hydrogen peroxide; and a phosphate compound.

Advantageous Effects

The copper etchant composition according to the present invention may uniformly remove copper plating which is a seed layer in the semi-additive process, and at the same time, have no change in etching properties such as an etching rate and etching uniformity even in the case of the increased number of processing sheets and increased processing time, and thus, having excellent etching performance.

DETAILED DESCRIPTION OF EMBODIMENTS

Figure 1:
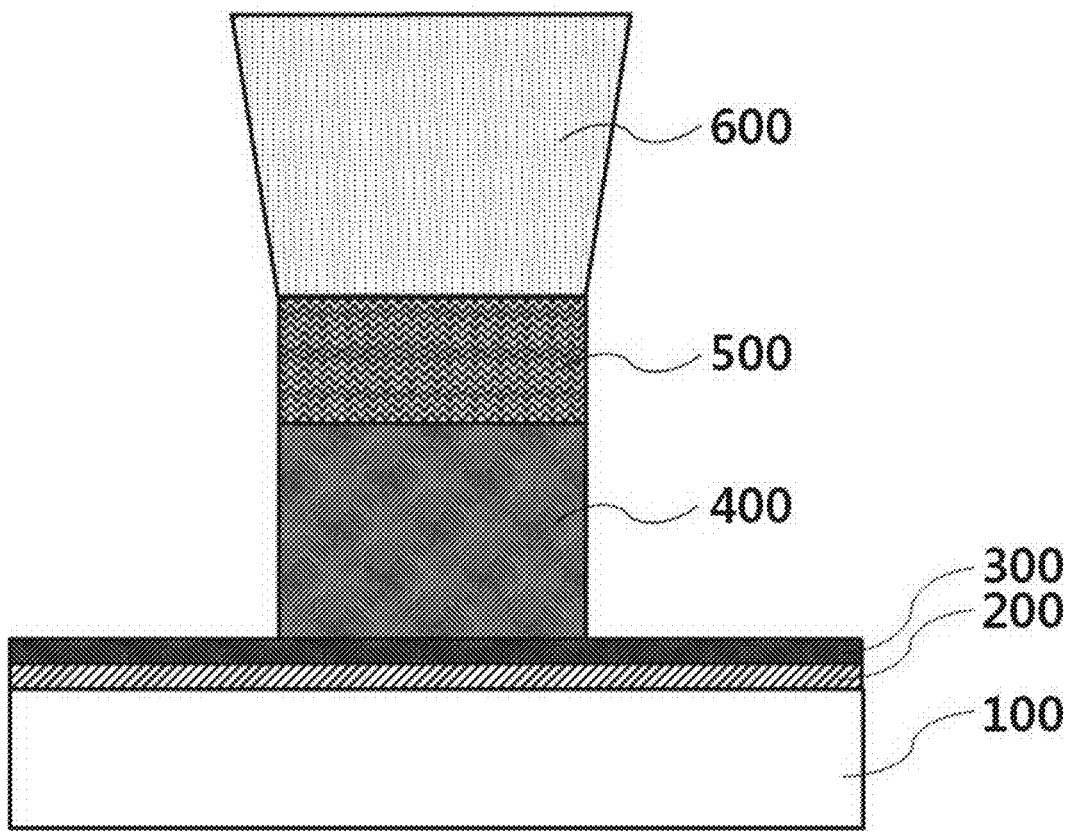
FIG. 1 illustrates a semiconductor device (bump) before etching copper using the copper etchant composition according to the present invention.
Figure 2:
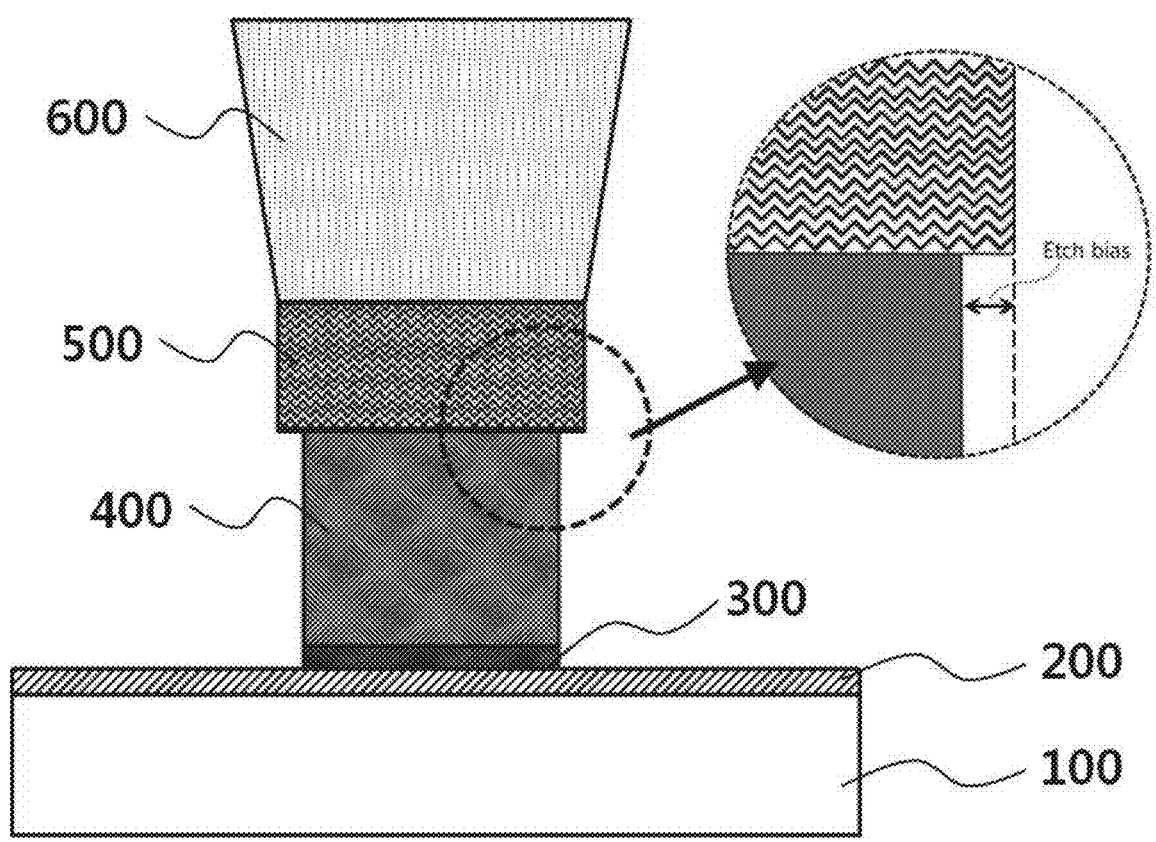
FIG. 2 illustrates a semiconductor device (bump) after etching copper using the copper etchant composition according to the present invention.

Hereinafter, the copper etchant composition according to the present invention will be described in detail with reference to the accompanying drawings. The drawings to be provided below are provided by way of example so that the idea of the present invention can be sufficiently transferred to a person skilled in the art to which the present invention pertains. Therefore, the present invention is not limited to the drawings provided below but may be modified in many different forms. In addition, the drawings suggested below will be exaggerated in order to clear the spirit and scope of the present invention. In addition, like reference numerals denote like elements throughout the specification.

Technical terms and scientific terms used herein have the general meaning understood by a person skilled in the art to which the present invention pertains unless otherwise defined, and a description for the known function and configuration obscuring the present invention will be omitted in the following description and the accompanying drawings.

The present invention relates to a copper etchant composition for removing a copper seed layer used in a semiconductor through-silicon via (TSV) manufacturing process, and the copper etchant in the present invention etches only copper and/or a copper alloy.

A copper etchant composition in a conventional semi-additive process had a change in etching properties, such as an increased metal content in the etchant composition (the increased number of processing sheets) as an etching process proceeds, or reduced etching rate and etching uniformity with increased processing time, which resulted in a fault phenomenon, such as non-uniform etching of a copper seed layer, and causing a residue.

The present invention is to solve this problem, and the copper etchant composition according to the present invention may uniformly remove a copper plated film which is a seed layer in the semi-additive process, and at the same time, have no change in etching properties such as an etching rate and etching uniformity even in the case of the increased number of processing sheets and increased processing time. In addition, as the composition has high etching performance to copper, it may not etch the metals other than copper, for example, metals such as titanium (Ti), nickel (Ni), tin (Sn), silver (Ag), gold (Au), aluminum (Al) and a tin-silver alloy, silicon nitride, silicon oxide, and the like, and thus, high reliability may be secured when manufacturing a device.

In the case that copper is dissolved in the etchant composition to be present as a copper ion, the copper ion may be present in the etchant composition in the most stable form of a coordination compound when its coordination number is 4 to 6. Accordingly, the present inventors used a first organic acid which is a chelating agent capable of being coordinate-bonded to a copper ion well to form a tri- or higher-dentate coordination, together with an amine compound capable of being additionally mono- or higher-dentate-coordinated with the copper ion, thereby forming total tetra- or higher-dentate, preferably tetra- to hexadentate coordination, so that the copper ions may be more stably present in the etchant composition. Thus, the copper etchant composition according to the present invention may maintain the etching properties of the etchant composition, even in the case of increasing the number of processing sheets to 200, or increasing etching time to 72 hours.

Specifically, the copper etchant composition according to an exemplary embodiment of the present invention may include: a first organic acid containing one or more amine groups, and one or more carboxylic acid groups; a second organic acid; an amine compound; hydrogen peroxide; and a phosphate compound. By the composition of such combination, the copper etchant composition of the present invention may have excellent copper and/or copper alloy etching performance, and also have excellent etching uniformity even in the case of the increased number of processing sheets and increased processing time. However, in the case that the first organic acid or the amine compound is not included, the copper ions are difficult to be stably present in the etchant composition, and thus, as the number of etched sheets are increased, etching performance may be decreased, and in the case that the second organic acid is not included, the etching rate of copper may be too low. Therefore, it may be preferred for etching copper to use the copper etchant composition of the above combination.

The copper etchant composition for this may include: 0.01 to 5 wt % of the first organic acid; 0.01 to 5 wt % of the second organic acid; 0.01 to 10 wt % of the amine compound; 0.5 to 10 wt % of hydrogen peroxide; and 0.01 to 10 wt % of the phosphate compound, based on the total weight of the composition, and the residual components not mentioned herein may be water such as ultra-pure water or deionized water. Copper may be etched with excellent efficiency within the above range. More preferably, the copper etchant composition may include: 0.5 to 3 wt % of the first organic acid; 0.5 to 3 wt % of the second organic acid; 0.01 to 1 wt % of the amine compound; 3 to 10 wt % of hydrogen peroxide; and 0.05 to 3 wt % of the phosphate compound, based on the total weigh of the composition, and the residual components not mentioned herein may be water such as ultra-pure water or deionized water. By using 0.5 to 3 wt % of the first organic acid, together with 0.01 to 1 wt % of the amine compound to further form a mono- or higher-dentate coordination with a copper ion, total tetra- or higher-dentate, preferably tetra- to hexadentate coordination may be formed, as described above. Accordingly, copper ions may be more stably present in the etchant composition, and the etching performance of the etchant composition may be maintained even in the case of increasing the number of processing sheets to 200, or increasing etching time to 72 hours. In addition, by using 0.5 to 3 wt % of the second organic acid, the etching rate of copper may be improved, and at the same time, the core part and external part of a copper film may be uniformly etched.

The first organic acid according to an exemplary embodiment of the present invention contains one or more amine groups and one or more carboxylic acid groups, and specifically, contains 1 to 4 amine groups and 1 to 6 carboxylic acid groups. More specifically, it is preferred to use a chelating agent capable of forming tri- or higher-dentate coordination with a copper ion as the first organic acid. As described above, a copper ion may be present as the most stable form of a coordination compound when its coordination number is 4 to 6, and thus, even in the case that the number of processing sheets or processing time is increased as the first organic acid is coordinate-bonded with the copper ion to form a coordination compound, the first organic acid inhibits the increase of a free copper ion concentration in the etchant composition, thereby maintaining the etching properties of the etchant composition.

As a specific example, the first organic acid may be any one or two or more selected from the group consisting of iminodiacetic acid, iminodisuccinic acid, ethylenediaminetetraacetic acid (EDTA), diethylenetriaminepentaacetic acid (DTPA), nitrilotriacetic acid (NTA), (2-hydroxyethyl)-ethylenediaminetriacetic acid (HEDTA), ethylenebis(oxyethylenenitrilo)tetraacetic acid (EGTA), and the salts thereof, but not necessarily limited thereto.

The second organic acid according to an exemplary embodiment of the present invention does not contain an amine group, and contains one or more carboxylic acid groups, and specifically, contains 1 to 6 carboxylic acid groups. The second organic acid may improve the solubility of copper to increase an etching rate. Specifically, the second organic acid is bonded to, and dissolves copper oxide, oxidized by hydrogen peroxide, thereby allowing copper to be more easily etched, as described below.

Particularly, it is preferred for etching copper to use the acid satisfying the following Equation 1 as the second organic acid, and where the acid does not satisfy Equation 1, the second organic acid is not bonded to copper oxide and dissolved in the etchant solution, so that the increased etching rate of copper may not be expected. Further, it may etch the metals other than copper, for example, metals such as titanium (Ti), nickel (Ni), tin (Sn), silver (Ag), gold (Au), aluminum (Al) and a tin-silver alloy, silicon nitride, silicon oxide, and the like, together with copper, and thus, is not preferred:

$$B-2 \leq A \leq B+2 \quad \text{[Equation 1]}$$

wherein A is pKa of the second organic acid; and B is pH of the copper etchant composition, in which B is pH 4 to 6.5.

As such, the second organic acid satisfying Equation 1 may be, specifically, any one or two or more selected from the group consisting of formic acid, acetic acid, butanoic acid, pentanoic acid, malonic acid, glycolic acid, succinic acid, citric acid, glutaric acid, tartaric acid, propionic acid, gluconic acid and the salts thereof, but not necessarily limited thereto.

The amine compound according to an exemplary embodiment of the present invention further forms mono- or higher-dentate coordination with a copper ion, together with forming tri- or higher-dentate coordination by the first organic acid which is a chelating agent, thereby forming total tetra- or higher-dentate, preferably tetra- to hexadentate coordination, so that the copper ion may be present as the most stable form of a coordination compound in the etchant composition, as described above.

In addition, the amine compound may decrease interfacial tension to act to allow the etching rate to be uniform on a wafer raw sheet by the difference of flow rate and physical strength, thereby improving etching uniformity. When the interfacial tension is high, the etching rate is low on the part with a low flow rate or low physical strength, and high on the part with a high flow rate or high physical strength, so that there may be a difference in the etching rate depending on the part of the device. Due to the partial difference in the etching rate as such, the diameter of a bump may become non-uniform.

As a specific example, the amine compound may be any one or two or more selected from the group consisting of C4 to C9 straight chained alkyl amine, C4 to C20 branched alkyl amine, C4 to C20 cycloalkylamine and C6 to C20 arylamine. When the straight chained alkyl amine has 3 or less carbon atoms, it has low vapor pressure and boiling point, so that it is easily volatilized, and when it has 10 or more carbon atoms, foaming occurs in the etchant composition, which is not preferred. Preferably, the amine compound may be any one or two or more selected from the group consisting of butylamine, pentylamine, hexylamine, heptylamine, octylamine, 2-ethyl-1-butanamine, 2-hexanamine and 2-ethyl-1-hexylamine, cyclohexylamine, and particularly, it is more preferred to use pentylamine, hexylamine, heptylamine, octylamine or 2-ethyl-1-hexylamine for improving etching uniformity.

The hydrogen peroxide ($H_2O_2$) according to an exemplary embodiment of the present invention serves to oxidize copper, and by oxidizing copper into copper oxide, etching may be performed by the etchant composition.

The phosphate compound according to an exemplary embodiment of the present invention which is a perhydrate stabilizer, may serve to inhibit the decomposition reaction of hydrogen peroxide due to the increased content of copper ions in the etchant composition with the etching process repetition, and at the same time, serve to be bonded to and dissolve oxidized copper to etch copper oxide, like the second organic acid, and accordingly, improve the etching rate of copper. As a specific example, the phosphate compound may be any one or two or more selected from the group consisting of $H_3PO_4$, $NaH_2PO_4$, $Na_2HPO_4$, $Na_3PO_4$, $NH_4H_2PO_4$, $(NH_4)_2HPO_4$, $(NH_4)_3PO_4$, $KH_2PO_4$, $K_2HPO_4$, $K_3PO_4$, $Ca(H_2PO_4)_2$, $Ca_2HPO_4$, $Ca_3PO_4$ and the like, but not necessarily limited thereto.

Hereinafter, the etchant composition according to the present invention will be described in more detail by the following Examples. However, the following Examples are only a reference for describing the present invention in detail, and the present invention is not limited thereto, and may be implemented in various forms. In addition, unless otherwise defined, all technical terms and scientific terms have the same meanings as those commonly understood by a person skilled in the art to which the present invention pertains. The terms used herein is only for effectively describing a certain exemplary embodiment, and not intended to limit the present invention. In addition, the singular form used in the specification and claims appended thereto may be intended to include a plural form also, unless otherwise indicated in the context. Further, unless otherwise stated, the unit of added materials herein is wt %.

Examples 1 to 29, and Comparative Examples 1 to 8

Copper etchant compositions having the components and contents (wt %) listed in the following Table 1 were prepared:

TABLE 1

| | Hydrogen peroxide | Phosphate | First organic acid | | Second organic acid | | Amine compound | | Water |
|---|---|---|---|---|---|---|---|---|---|
| Example 1 | 5 | KP2 1 | IDA | 2 | MA | 1 | b-AM | 0.2 | 90.8 |
| Example 2 | 5 | KP2 1 | IDA | 2 | MA | 1 | p-AM | 0.2 | 90.8 |
| Example 3 | 5 | KP2 1 | IDA | 2 | MA | 1 | hx-AM | 0.2 | 90.8 |
| Example 4 | 5 | KP2 1 | IDA | 2 | MA | 1 | hp-AM | 0.2 | 90.8 |
| Example 5 | 5 | KP2 1 | IDA | 2 | MA | 1 | o-AM | 0.2 | 90.8 |
| Example 6 | 5 | KP2 1 | IDA | 2 | MA | 1 | 2-et-1-b-AM | 0.2 | 90.8 |
| Example 7 | 5 | KP2 1 | IDA | 2 | MA | 1 | 2-hxa-AM | 0.2 | 90.8 |
| Example 8 | 5 | KP2 1 | IDA | 2 | MA | 1 | 2-et-1-hx-AM | 0.2 | 90.8 |
| Example 9 | 5 | KP2 1 | IDA | 2 | MA | 1 | cyhx-AM | 0.2 | 90.8 |
| Example 10 | 5 | KP2 1 | IDA | 2 | MA | 1 | hx-AM | 0.05 | 90.95 |
| Example 11 | 5 | KP2 1 | IDA | 2 | MA | 1 | hx-AM | 0.1 | 90.9 |
| Example 12 | 5 | KP2 1 | IDA | 2 | MA | 1 | hx-AM | 0.3 | 90.7 |
| Example 13 | 5 | KP2 1 | IDA | 2 | MA | 1 | hx-AM | 0.5 | 90.5 |
| Example 14 | 5 | KP2 1 | IDA | 2 | GA | 1 | hx-AM | 0.2 | 90.8 |
| Example 15 | 5 | KP2 1 | EDTA | 1.6 | MA | 1 | hx-AM | 0.2 | 91.2 |
| Example 16 | 5 | KP2 1 | IDA | 2 | GA | 2 | hx-AM | 0.2 | 89.8 |
| Example 17 | 5 | KP2 1 | EDTA | 1.6 | GA | 2 | hx-AM | 0.2 | 90.2 |
| Example 18 | 5 | KP2 1 | NTA | 1.5 | GA | 2 | hx-AM | 0.2 | 90.3 |
| Example 19 | 5 | KP2 1 | DTPA | 1 | GA | 2 | hx-AM | 0.2 | 90.8 |
| Example 20 | 5 | KP2 1 | IDA | 2 | SA | 2 | hx-AM | 0.2 | 89.8 |
| Example 21 | 5 | KP2 1 | IDA | 2 | CA | 2 | hx-AM | 0.2 | 89.8 |
| Example 22 | 5 | KP2 1 | IDA | 2 | GTA | 2 | hx-AM | 0.2 | 89.8 |
| Example 23 | 5 | KP2 1 | IDA | 2 | MA | 2 | hx-AM | 0.2 | 89.8 |
| Example 24 | 5 | KP2 1 | IDA | 2 | TA | 2 | hx-AM | 0.2 | 89.8 |
| Example 25 | 5 | KP2 1 | IDA | 2 | GA | 2 | p-AM | 0.2 | 89.8 |
| Example 26 | 5 | KP2 1 | IDA | 2 | GA | 2 | hp-AM | 0.2 | 89.8 |
| Example 27 | 5 | KP2 1 | IDA | 2 | GA | 2 | o-AM | 0.2 | 89.8 |
| Example 28 | 5 | KP2 1 | IDA | 2 | GA | 2 | 2-et-1-hx-AM | 0.2 | 89.8 |
| Example 29 | 5 | KP2 1 | IDA | 2 | GA | 2 | cyhx-AM | 0.2 | 89.8 |
| Comparative Example 1 | 5 | KP2 1 | IDA | 2 | MA | 1 | — | — | 91 |
| Comparative Example 2 | 5 | KP2 1 | IDA | 2 | GA | 1 | — | — | 91 |

TABLE 1-continued

|  | Hydrogen peroxide | Phosphate | First organic acid | | Second organic acid | | Amine compound | | Water |
|---|---|---|---|---|---|---|---|---|---|
| Comparative Example 3 | 5 | KP2 1 | EDTA | 1.6 | MA | 1 | — | — | 91.4 |
| Comparative Example 4 | 5 | KP2 1 | — | — | GA | 2 | hx-AM | 0.2 | 91.8 |
| Comparative Example 5 | 5 | KP2 1 | IDA | 2 | GA | 2 | — | — | 90 |
| Comparative Example 6 | 5 | KP2 1 | GTA | 2 | GA | 2 | hx-AM | 0.2 | 89.8 |
| Comparative Example 7 | 5 | KP2 1 | IDA | 2 | — | — | hx-AM | 0.2 | 91.8 |
| Comparative Example 8 | 5 | KP2 1 | — | — | CA | 2 | hx-AM | 0.2 | 91.8 |

[KP2: dipotassium phosphate,
IDA: iminodiacetic acid,
EDTA: ethylenediaminetetraacetic acid,
MA: malonic acid,
GA: glycolic acid,
SA: succinic acid,
CA: citric acid,
GTA: glutaric acid,
TA: tartaric acid,
b-AM: butylamine,
p-AM: pentylamine,
hx-AM: hexylamine,
hp-AM: heptylamine,
o-AM: octylamine,
2-et-1-b-AM: 2-ethyl-1-butanamine,
2-hxa-AM: 2-Hexanamine,
2-et-1-hx-AM: 2-ethyl-1-hexylamine,
cyhx-AM: cyclohexylamine]

[Etching Uniformity Evaluation]

In order to evaluate the etching uniformity effect of the copper etchant composition according to the present invention, a copper (Cu) seed layer having a thickness of 4000 Å was deposited on a silicon wafer substrate having a diameter of 300 mm. Next, a pattern was formed on the copper seed layer by a photolithography process to prepare a specimen. Etching was performed by equipment capable of single spin etching.

Etching uniformity evaluation of the copper seed layer was performed by using the etchant compositions of Examples 1 to 29, and those of Comparative Examples 1 to 8 to carry out etching for 35 seconds in a single spin etcher, and then in order to observe the etching uniformity of the copper seed layer, observing the thickness of the etched copper seed layer at two points of 0 and 100 mm from the center of the wafer with a scanning electron microscope (S-4800, manufactured by Hitachi, Ltd.), and the results are shown in Table 2. In addition, the surface tension of each of the etchant compositions of Examples and Comparative Examples was measured with a surface tensiometer (K-100, manufactured by KRUSS GmbH), and the results are also shown in Table 2.

TABLE 2

| | Surface tension (dyne/cm) | Etching rate depending on etching thickness after etching copper seed layer for 35 seconds (Å/s) | | Etching rate difference (Å/s) |
|---|---|---|---|---|
| | | Wafer center | 100 mm point from the center | |
| Example 1 | 71 | 57.4 | 56.7 | 0.7 |
| Example 2 | 67 | 57.4 | 56.9 | 0.5 |
| Example 3 | 63 | 57.4 | 57.3 | 0.1 |
| Example 4 | 60 | 57.4 | 57.3 | 0.1 |
| Example 5 | 59 | 57.5 | 57.4 | 0.1 |
| Example 6 | 72 | 57.1 | 56.7 | 0.4 |
| Example 7 | 70 | 57.4 | 56.8 | 0.6 |
| Example 8 | 71 | 57.1 | 56.6 | 0.5 |
| Example 9 | 71 | 57.2 | 56.6 | 0.6 |
| Example 10 | 68 | 57.4 | 57.3 | 0.1 |
| Example 11 | 65 | 56.9 | 56.8 | 0.1 |
| Example 12 | 60 | 57.4 | 57.2 | 0.2 |
| Example 13 | 59 | 57.2 | 57.0 | 0.2 |
| Example 14 | 62 | 53.1 | 52.8 | 0.3 |
| Example 15 | 63 | 68.7 | 68.2 | 0.5 |
| Example 16 | 62 | 75.3 | 74.7 | 0.6 |
| Example 17 | 63 | 76.2 | 75.7 | 0.5 |
| Example 18 | 61 | 78.6 | 78.4 | 0.2 |
| Example 19 | 62 | 75.8 | 75.2 | 0.6 |
| Example 20 | 63 | 51.4 | 50.6 | 0.8 |
| Example 21 | 63 | 52.2 | 51.8 | 0.4 |
| Example 22 | 63 | 52.6 | 52.4 | 0.2 |
| Example 23 | 63 | 80.0 | 79.5 | 0.5 |
| Example 24 | 63 | 51.8 | 51.2 | 0.6 |
| Example 25 | 63 | 70.6 | 70.4 | 0.2 |
| Example 26 | 63 | 70.6 | 70.4 | 0.2 |
| Example 27 | 67 | 70.0 | 69.5 | 0.5 |
| Example 28 | 71 | 71.0 | 71.0 | 0.0 |
| Example 29 | 71 | 69.2 | 68.3 | 0.9 |
| Comparative Example 1 | 74.5 | 57.4 | 53.5 | 3.9 |
| Comparative Example 2 | 74 | 57.2 | 52.7 | 4.5 |
| Comparative Example 3 | 74 | 51.3 | 45.2 | 6.1 |
| Comparative Example 4 | 64 | 56.8 | 53.1 | 3.7 |
| Comparative Example 5 | 74 | 70.7 | 66.4 | 4.3 |

TABLE 2-continued

| | Surface tension (dyne/cm) | Etching rate depending on etching thickness after etching copper seed layer for 35 seconds (Å/s) | | Etching rate difference (Å/s) |
|---|---|---|---|---|
| | | Wafer center | 100 mm point from the center | |
| Comparative Example 6 | 63 | 78.8 | 74.3 | 4.5 |
| Comparative Example 7 | 64 | 38.5 | 33.4 | 5.1 |
| Comparative Example 8 | 63 | 44.6 | 38.6 | 6.0 |

As seen from Table 2, it was confirmed that Examples 1 to 29 according to the present invention used the first organic acid, the second organic acid, and the amine compound, thereby having very superior etching uniformity, as compared with Comparative Examples 1 to 8.

[Etching Property Evaluation]

In order to evaluate the etching properties depending on the increased number of processing sheets and the increased processing time of the copper etchant composition according to the present invention, a substrate (bump) having the structure as illustrated in FIG. 1 was prepared. Specifically, a titanium (Ti) seed layer having a thickness of 300 Å was deposited on a silicon wafer substrate having a diameter of 300 mm, and then a copper (Cu) seed layer having a thickness of 5,500 Å was deposited on the titanium seed layer. Next, a copper metal layer having a thickness of 155,000 Å, a Ni layer having a thickness of 40,000 Å, and a SnAg alloy solder ball (SD) having a thickness of 160,000 Å were sequentially formed by an electroplating method.

For etching property evaluation depending on the increased number of processing sheets of the copper seed layer, copper powder was dissolved at 0, 500, 1000 and 2000 ppm in the etchant compositions of Examples 1 to 29, and those of Comparative Examples 1 to 8, and then etching was carried out. Etching time was 70% over-etching time, which is the time to further carry out etching for another 70% of the time to remove the copper seed layer of 4000 Å in an etchant composition of 0 ppm copper. After finishing the etching process, a unilateral difference between the electroplated copper layer etched by the etchant composition and the unetched nickel layer was designated as an etch bias, and measured, and the results are shown in Table 3.

In addition, the etch property evaluation depending on the processing time was carried out by dissolving 1000 ppm of copper powder in the etchant compositions of Examples 1 to 29, and those of Comparative Examples 1 to 8, and then proceeding with an etching process every 12 hours to 0, 12, 24, 36, 48, 60 and 72 hours to measure the change in an etching degree, and the results are shown in Table 3:

TABLE 3

| | 70% over-etch bias (μm) by copper dissolution concentration (ppm) | | | | | 70% over-etch bias (μm) by test time (hr) at 1000 ppm of copper | | | | | | |
|---|---|---|---|---|---|---|---|---|---|---|---|---|
| | 0 | 500 | 1,000 | 1,500 | 2,000 | 0 | 12 | 24 | 36 | 48 | 60 | 72 |
| Example 1 | 0.65 | 0.67 | 0.65 | 0.65 | 0.65 | 0.67 | 0.65 | 0.65 | 0.67 | 0.65 | 0.65 | 0.65 |
| Example 2 | 0.67 | 0.65 | 0.65 | 0.67 | 0.67 | 0.65 | 0.67 | 0.65 | 0.65 | 0.67 | 0.65 | 0.65 |
| Example 3 | 0.65 | 0.67 | 0.65 | 0.65 | 0.67 | 0.67 | 0.67 | 0.65 | 0.67 | 0.65 | 0.65 | 0.67 |
| Example 4 | 0.65 | 0.65 | 0.65 | 0.65 | 0.65 | 0.65 | 0.67 | 0.65 | 0.67 | 0.65 | 0.67 | 0.65 |
| Example 5 | 0.65 | 0.67 | 0.67 | 0.65 | 0.65 | 0.65 | 0.65 | 0.65 | 0.65 | 0.65 | 0.67 | 0.65 |
| Example 6 | 0.67 | 0.67 | 0.65 | 0.65 | 0.65 | 0.67 | 0.67 | 0.65 | 0.65 | 0.67 | 0.65 | 0.65 |
| Example 7 | 0.65 | 0.67 | 0.65 | 0.67 | 0.65 | 0.67 | 0.65 | 0.65 | 0.65 | 0.65 | 0.65 | 0.65 |
| Example 8 | 0.65 | 0.65 | 0.65 | 0.65 | 0.67 | 0.65 | 0.65 | 0.67 | 0.65 | 0.65 | 0.65 | 0.67 |
| Example 9 | 0.65 | 0.65 | 0.65 | 0.67 | 0.65 | 0.65 | 0.67 | 0.65 | 0.65 | 0.67 | 0.65 | 0.65 |
| Example 10 | 0.65 | 0.65 | 0.65 | 0.67 | 0.65 | 0.65 | 0.65 | 0.67 | 0.65 | 0.67 | 0.67 | 0.65 |
| Example 11 | 0.65 | 0.67 | 0.65 | 0.67 | 0.65 | 0.67 | 0.65 | 0.67 | 0.67 | 0.67 | 0.65 | 0.65 |
| Example 12 | 0.67 | 0.65 | 0.67 | 0.67 | 0.65 | 0.65 | 0.65 | 0.65 | 0.65 | 0.67 | 0.65 | 0.65 |
| Example 13 | 0.65 | 0.65 | 0.65 | 0.65 | 0.65 | 0.67 | 0.65 | 0.65 | 0.65 | 0.67 | 0.67 | 0.67 |
| Example 14 | 0.65 | 0.67 | 0.65 | 0.67 | 0.65 | 0.65 | 0.65 | 0.65 | 0.65 | 0.65 | 0.65 | 0.65 |
| Example 15 | 0.65 | 0.65 | 0.67 | 0.65 | 0.65 | 0.67 | 0.65 | 0.65 | 0.67 | 0.65 | 0.65 | 0.67 |
| Example 16 | 0.67 | 0.67 | 0.65 | 0.65 | 0.67 | 0.67 | 0.65 | 0.65 | 0.65 | 0.65 | 0.67 | 0.67 |
| Example 17 | 0.65 | 0.65 | 0.67 | 0.67 | 0.65 | 0.65 | 0.65 | 0.67 | 0.67 | 0.67 | 0.65 | 0.65 |
| Example 18 | 0.65 | 0.65 | 0.65 | 0.65 | 0.67 | 0.67 | 0.67 | 0.67 | 0.67 | 0.65 | 0.65 | 0.65 |
| Example 19 | 0.65 | 0.67 | 0.67 | 0.65 | 0.67 | 0.67 | 0.65 | 0.65 | 0.65 | 0.67 | 0.65 | 0.65 |
| Example 20 | 0.67 | 0.65 | 0.65 | 0.67 | 0.65 | 0.65 | 0.65 | 0.65 | 0.65 | 0.65 | 0.65 | 0.65 |
| Example 21 | 0.67 | 0.65 | 0.67 | 0.65 | 0.65 | 0.67 | 0.65 | 0.67 | 0.65 | 0.67 | 0.65 | 0.67 |
| Example 22 | 0.67 | 0.65 | 0.65 | 0.65 | 0.65 | 0.65 | 0.65 | 0.65 | 0.65 | 0.65 | 0.65 | 0.67 |
| Example 23 | 0.67 | 0.65 | 0.67 | 0.65 | 0.67 | 0.65 | 0.65 | 0.65 | 0.65 | 0.65 | 0.67 | 0.65 |
| Example 24 | 0.65 | 0.65 | 0.65 | 0.65 | 0.67 | 0.67 | 0.67 | 0.65 | 0.65 | 0.65 | 0.65 | 0.65 |
| Example 25 | 0.65 | 0.67 | 0.65 | 0.65 | 0.65 | 0.65 | 0.65 | 0.65 | 0.65 | 0.65 | 0.67 | 0.61 |
| Example 26 | 0.65 | 0.67 | 0.65 | 0.65 | 0.67 | 0.65 | 0.65 | 0.67 | 0.65 | 0.65 | 0.65 | 0.67 |
| Example 27 | 0.67 | 0.65 | 0.67 | 0.65 | 0.65 | 0.65 | 0.65 | 0.65 | 0.67 | 0.67 | 0.65 | 0.65 |
| Example 28 | 0.65 | 0.65 | 0.67 | 0.67 | 0.65 | 0.65 | 0.65 | 0.65 | 0.65 | 0.65 | 0.65 | 0.67 |
| Example 29 | 0.65 | 0.65 | 0.65 | 0.67 | 0.65 | 0.67 | 0.65 | 0.65 | 0.65 | 0.65 | 0.65 | 0.59 |
| Comparative Example 1 | 0.65 | 0.67 | 0.61 | 0.49 | 0.31 | 0.62 | 0.55 | 0.49 | 0.29 | 0.17 | 0.05 | 0.00 |
| Comparative Example 2 | 0.65 | 0.65 | 0.59 | 0.47 | 0.41 | 0.59 | 0.51 | 0.43 | 0.33 | 0.19 | 0.05 | 0.00 |
| Comparative Example 3 | 0.67 | 0.67 | 0.61 | 0.53 | 0.45 | 0.61 | 0.57 | 0.51 | 0.35 | 0.27 | 0.17 | 0.09 |
| Comparative Example 4 | 0.67 | 0.59 | 0.37 | 0.13 | 0.00 | 0.37 | 0.35 | 0.27 | 0.17 | 0.03 | 0.00 | 0.00 |
| Comparative Example 5 | 0.67 | 0.65 | 0.53 | 0.37 | 0.23 | 0.53 | 0.53 | 0.51 | 0.47 | 0.39 | 0.21 | 0.13 |

TABLE 3-continued

|  | 70% over-etch bias (μm) by copper dissolution concentration (ppm) | | | | | 70% over-etch bias (μm) by test time (hr) at 1000 ppm of copper | | | | | | |
|---|---|---|---|---|---|---|---|---|---|---|---|---|
|  | 0 | 500 | 1,000 | 1,500 | 2,000 | 0 | 12 | 24 | 36 | 48 | 60 | 72 |
| Comparative Example 6 | 0.65 | 0.61 | 0.43 | 0.25 | 0.09 | 0.43 | 0.41 | 0.37 | 0.31 | 0.15 | 0.03 | 0.00 |
| Comparative Example 7 | 0.65 | 0.65 | 0.55 | 0.41 | 0.23 | 0.55 | 0.52 | 0.27 | 0.19 | 0.09 | 0.01 | 0.00 |
| Comparative Example 8 | 0.65 | 0.63 | 0.59 | 0.45 | 0.31 | 0.59 | 0.47 | 0.39 | 0.27 | 0.13 | 0.00 | 0.00 |

As seen from Table 3, it was confirmed that Examples 1 to 29 according to the present invention used the first organic acid, the second organic acid, and the amine compound, thereby maintaining copper etching performance even in the case of increasing the copper ion concentration and etching time, whereas in Comparative Examples 1 to 8, as the copper ion concentration or the etching time are increased, etching performance was greatly lowered.

Hereinabove, although the present invention has been described by specific matters, Examples, and Comparative Examples, they have been provided only for assisting in the entire understanding of the present invention. Therefore, the present invention is not limited to the above Examples. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

DETAILED DESCRIPTION OF MAIN ELEMENTS

| 100: Silicon wafer | 200: Titanium (Ti) seed layer |
|---|---|
| 300: Copper (Cu) seed layer | 400: Copper (Cu) metal layer |
| 500: Nickel (Ni) metal layer | 600: Solder ball (SD) |

What is claimed is:

1. A copper etchant composition consisting essentially of:
   0.01 to 5 wt % of a first organic acid containing one or more amine groups and one or more carboxylic acid groups, based on a total weight of the composition;
   0.01 to 5 wt % of a second organic acid, wherein the second organic acid does not contain an amine group, and wherein the second organic acid contains one or more carboxylic acid groups, based on a total weight of the composition;
   0.01 to 10 wt % of an amine compound, based on a total weight of the composition;
   0.5 to 10 wt % of hydrogen peroxide, based on a total weight of the composition;
   0.01 to 10 wt % of a phosphate compound, based on a total weight of the composition; and
   water,
   wherein the first organic acid is any one or two or more selected from the group consisting of iminodiacetic acid, iminodisuccinic acid, ethylenediaminetetraacetic acid, diethylenetriaminepentaacetic acid, nitrilotriacetic acid, hydroxyethylethylenediamine triacetic acid, ethylenebis(oxyethylenenitrilo)tetraacetic acid, and salts thereof,
   wherein the second organic acid is any one or two or more selected from the group consisting of formic acid, acetic acid, butanoic acid, pentanoic acid, malonic acid, glycolic acid, succinic acid, citric acid, glutaric acid, tartaric acid, propionic acid, gluconic acid, and salts thereof,
   wherein the amine compound is any one or two or more selected from the group consisting of butylamine, pentylamine, hexylamine, heptylamine, octylamine, 2-ethyl-1-butanamine, 2-hexanamine, 2-ethyl-1-hexylamine, and cyclohexylamine, and wherein the phosphate compound is any one or two or more selected from the group consisting of $NaH_2PO_4$, $Na_2HPO_4$, $Na_3PO_4$, $NH_4H_2PO_4$, $(NH_4)_2HPO_4$, $(NH_4)_3PO_4$, $KH_2PO_4$, $K_2HPO_4$, $K_3PO_4$, $Ca(H_2PO_4)_2$, $Ca_2HPO_4$, and $Ca_3PO_4$.

2. The copper etchant composition of claim 1, wherein the second organic acid satisfies the following Equation 1:

$$B-2 \leq A \leq B+2 \quad \text{[Equation 1]}$$

wherein A is pKa of the second organic acid; and B is pH of the copper etchant composition, in which B is pH 4 to 6.5.

* * * * *